(12) United States Patent
Kishimoto

(10) Patent No.: US 11,765,958 B2
(45) Date of Patent: Sep. 19, 2023

(54) DISPLAY DEVICE

(71) Applicant: SAMSUNG DISPLAY CO., LTD., Yongin-si (KR)

(72) Inventor: Hirotsugu Kishimoto, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/358,202

(22) Filed: Mar. 19, 2019

(65) Prior Publication Data

US 2019/0333971 A1    Oct. 31, 2019

(30) Foreign Application Priority Data

Apr. 27, 2018    (KR) .......................... 10-2018-0049401

(51) Int. Cl.
| | |
|---|---|
| *H10K 50/844* | (2023.01) |
| *H10K 59/60* | (2023.01) |
| *G06F 3/042* | (2006.01) |
| *G06F 3/041* | (2006.01) |
| *G06V 40/13* | (2022.01) |
| *H10K 50/842* | (2023.01) |
| *H10K 59/40* | (2023.01) |

(52) U.S. Cl.
CPC .......... *H10K 59/60* (2023.02); *G06F 3/0412* (2013.01); *G06F 3/0421* (2013.01); *G06V 40/1318* (2022.01); *H10K 50/8426* (2023.02); *H10K 50/8445* (2023.02); *H10K 59/40* (2023.02)

(58) Field of Classification Search
CPC ............... H01L 27/3227; H01L 27/323; H01L 27/3269; H01L 27/3241–3297; H01L 51/5246; H01L 51/0097; H01L 51/5237–5256; G06F 3/0412; G06F 3/0421; G06K 9/0004; B32B 2307/40; G02F 1/1362–1368; G02F 1/1333–133305; H10K 59/40; H10K 59/8731; H10K 50/8445
See application file for complete search history.

(56) References Cited

U.S. PATENT DOCUMENTS

| | | | |
|---|---|---|---|
| 9,394,416 B2* | 7/2016 | Iwase | ........................ G02B 1/14 |
| 9,685,493 B2 | 6/2017 | Kim et al. | |
| 10,014,362 B2 | 7/2018 | Jo et al. | |
| 2006/0003189 A1* | 1/2006 | Kim | .................... H01L 51/5256 |
| | | | 428/704 |
| 2008/0193717 A1* | 8/2008 | Jongerden | ............... B32B 15/04 |
| | | | 428/142 |

(Continued)

FOREIGN PATENT DOCUMENTS

| | | |
|---|---|---|
| JP | 2005-262554 | 9/2005 |
| JP | 2016-141644 | 8/2016 |

(Continued)

*Primary Examiner* — Eric K Ashbahian
(74) *Attorney, Agent, or Firm* — F. CHAU & ASSOCIATES, LLC

(57) ABSTRACT

A display device includes a substrate; a barrier layer above a first surface of the substrate; a protective film below a second surface of the substrate opposite the first surface; an adhesive member between the substrate and the protective film; and an optical sensor below a second surface of the protective film opposite a first surface of the protective film that faces the second surface of the substrate.

9 Claims, 7 Drawing Sheets

(56) References Cited

U.S. PATENT DOCUMENTS

| | | | | |
|---|---|---|---|---|
| 2010/0201929 | A1* | 8/2010 | Okada | G02B 1/105 |
| | | | | 349/122 |
| 2014/0349091 | A1* | 11/2014 | Yan | H01L 51/5256 |
| | | | | 428/212 |
| 2016/0043153 | A1* | 2/2016 | Min | H01L 51/0097 |
| | | | | 257/40 |
| 2016/0301844 | A1* | 10/2016 | Smith | G01N 21/00 |
| 2017/0221976 | A1 | 8/2017 | Park et al. | |
| 2017/0301739 | A1 | 10/2017 | Park et al. | |
| 2018/0005005 | A1* | 1/2018 | He | G06F 3/0418 |
| 2018/0031713 | A1* | 2/2018 | Ojima | G01T 1/202 |
| 2018/0074377 | A1* | 3/2018 | You | G02F 1/134363 |
| 2018/0154345 | A1* | 6/2018 | Dadheech | B01J 21/063 |
| 2018/0275435 | A1* | 9/2018 | Liu | G02F 1/16755 |
| 2019/0004642 | A1* | 1/2019 | Chen | G06F 3/0443 |
| 2019/0006616 | A1* | 1/2019 | Nishimura | H01L 51/5246 |
| 2019/0036071 | A1* | 1/2019 | Wang | C09J 9/00 |
| 2019/0039349 | A1* | 2/2019 | Shoda | B32B 27/32 |
| 2019/0050095 | A1* | 2/2019 | Schwartz | G06F 3/0416 |
| 2019/0051709 | A1* | 2/2019 | Puszka | H01L 27/3272 |
| 2019/0087630 | A1* | 3/2019 | Seo | G06K 9/0002 |
| 2019/0258098 | A1* | 8/2019 | Oba | G02F 1/1336 |

FOREIGN PATENT DOCUMENTS

| | | |
|---|---|---|
| JP | 2017-191779 | 10/2017 |
| KR | 10-2016-0034091 | 3/2016 |
| KR | 10-2016-0059586 | 5/2016 |
| KR | 10-2016-0098553 | 8/2016 |
| KR | 10-2017-0032524 | 3/2017 |
| KR | 10-2017-0091208 | 8/2017 |
| KR | 10-2017-0119569 | 10/2017 |

* cited by examiner

DISPLAY DEVICE

CROSS-REFERENCE TO RELATED APPLICATION

This application claims priority under 35 U.S.C. § 119 from, and the benefit of, Korean Patent Application No. 10-2018-0049401, filed on Apr. 27, 2018 in the Korean Intellectual Property Office, the contents of which are herein incorporated by reference in their entirety.

BACKGROUND

1. Technical Field

One or more embodiments are directed to a display device and more particularly, to a display device that includes an optical sensor.

2. Discussion of the Related Art

Recently, the demand for a display device that provides various functions such as a fingerprint sensing function is increasing. A capacitive-type fingerprint sensor uses a semiconductor device sensitive to voltage and current to detect capacitance formed when a user's fingerprint touches an electrode on a pixel, and to acquire an image of the fingerprint. An optical fingerprint sensor includes a light source and an image sensor, in which the image sensor acquires a user's fingerprint image by sensing an image reflected by the fingerprint.

SUMMARY

One or more embodiments include a display device that provides an optical sensor that can sense a fingerprint and has high transmittance.

According to one or more embodiments, a display device includes: a substrate; a barrier layer above a first surface of the substrate; a protective film below a second surface of the substrate opposite the first surface of the substrate; an adhesive member between the substrate and the protective film; and an optical sensor below a second surface of the protective film opposite a first surface of the protective film that faces the second surface of the substrate.

A refractive index of the barrier layer may range from about 1.65 to about 1.8.

A refractive index of the adhesive member may range from about 1.5 to about 1.7.

A refractive index of the barrier layer may be equal to the refractive index of the adhesive member.

The substrate may include: a first layer that includes an organic material; a second layer above the first layer, where the second layer includes an inorganic material; and a third layer above the second layer, where the third layer includes an organic material, where the barrier layer is above the third layer and includes an inorganic material.

A refractive index of the second layer may range from about 1.85 to about 1.8.

A thickness of the second layer may be less than a thickness of the first layer. A thickness of the first layer may be equal to a thickness of the third layer. A thickness of the second layer may be equal to a thickness of the barrier layer.

The display device may further include: a sealing member above the barrier layer; an optical member above the sealing member; and a window above the optical member.

The optical sensor may include: a photodetector that receives light emitted by the display device in a window direction that is reflected in a substrate direction from the optical member The optical sensor may include: a light source that emits light in a window direction; and a photodetector that receives emitted light that is reflected in a substrate direction from the optical member A thickness of the adhesive member may be greater than a thickness of the substrate.

According to one or more embodiments, a display device includes: a substrate; a sealing member that covers a first surface of the substrate; a protective film below a second surface of the substrate opposite the first surface; an adhesive member between the substrate and the protective film; and an optical sensor opposite the substrate with the protective film therebetween.

The substrate may include: a first layer that includes an organic material; a second layer above the first layer, where the second layer includes an inorganic material; a third layer above the second layer, where the third layer includes an organic material; and a fourth layer above the third layer, where the fourth layer includes an inorganic material.

The display device may include: an optical member above the sealing member; and a window above the optical member.

The optical sensor may include: a photodetector that receives light emitted by the display device in a window direction that is reflected in a substrate direction from the optical member.

The optical sensor may include: a light source that emits light in a window direction; and a photodetector that receives emitted reflected light that is reflected in a substrate direction from the optical member According to one or more embodiments, a display device includes: a substrate; an optical member above the substrate; a window above the optical member; and an optical sensor below the substrate. The optical sensor includes a photodetector that receives light emitted in a window direction that is reflected in a substrate direction from the optical member.

The display device may further include: a sealing member between the optical member and a first surface of the substrate; a protective film below a second surface of the substrate opposite the first surface and above the optical sensor; and an adhesive member between the substrate and the protective film.

The optical sensor may further include a light source that emits the light in a window direction.

The substrate may include: a first layer that includes an organic material; a second layer above the first layer, where the second layer includes an inorganic material; a third layer above the second layer, where the third layer includes an organic material; and a fourth layer above the third layer, where the fourth layer includes an inorganic material. A refractive index of the fourth layer may range from 1.65 to 1.8, a refractive index of the adhesive member may range from 1.5 to 1.7, and a refractive index of the second layer may range from 1.65 to 1.8.

DETAILED DESCRIPTION

Figure 1:
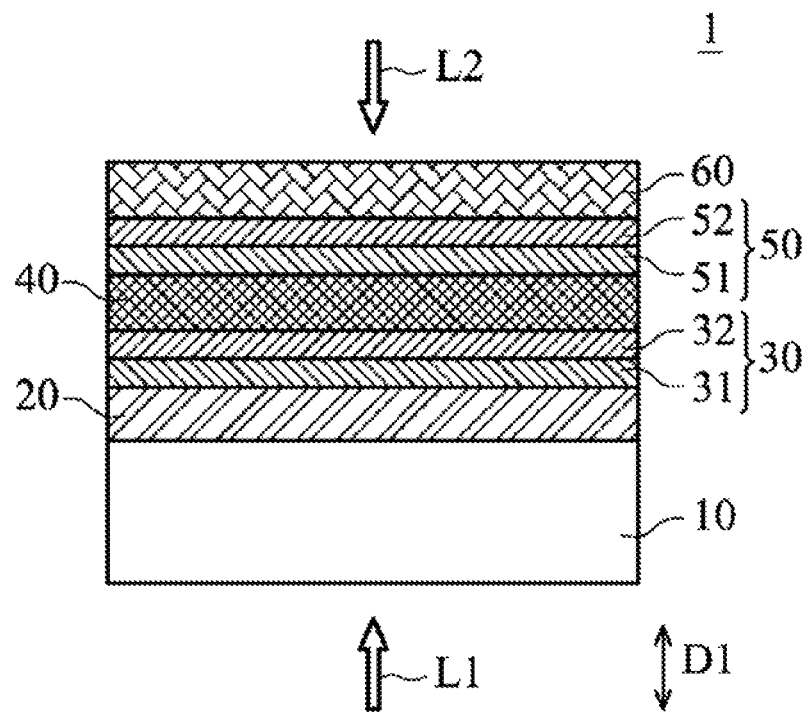
FIG. 1 is a perspective view of a display device according to an embodiment.

Reference will now be made in detail to embodiments, examples of which are illustrated in the accompanying drawings, wherein like reference numerals may refer to like elements throughout. In this regard, the present embodiments may have different forms and should not be construed as being limited to the descriptions set forth herein.

Sizes of components in the drawings may be exaggerated for convenience of explanation.

Hereinafter, embodiments will be described in detail with reference to the accompanying drawings. The same reference numerals may be used to denote the same elements, and repeated descriptions thereof will be omitted.

Figure 2:
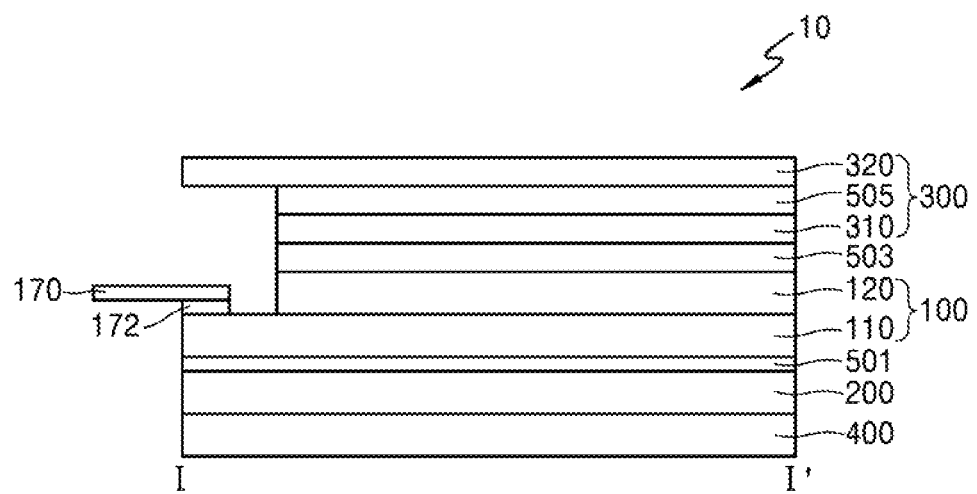
FIG. 2 is a partial cross-sectional view of the display device, taken along a line I-I' of FIG. 1.
Figure 3:
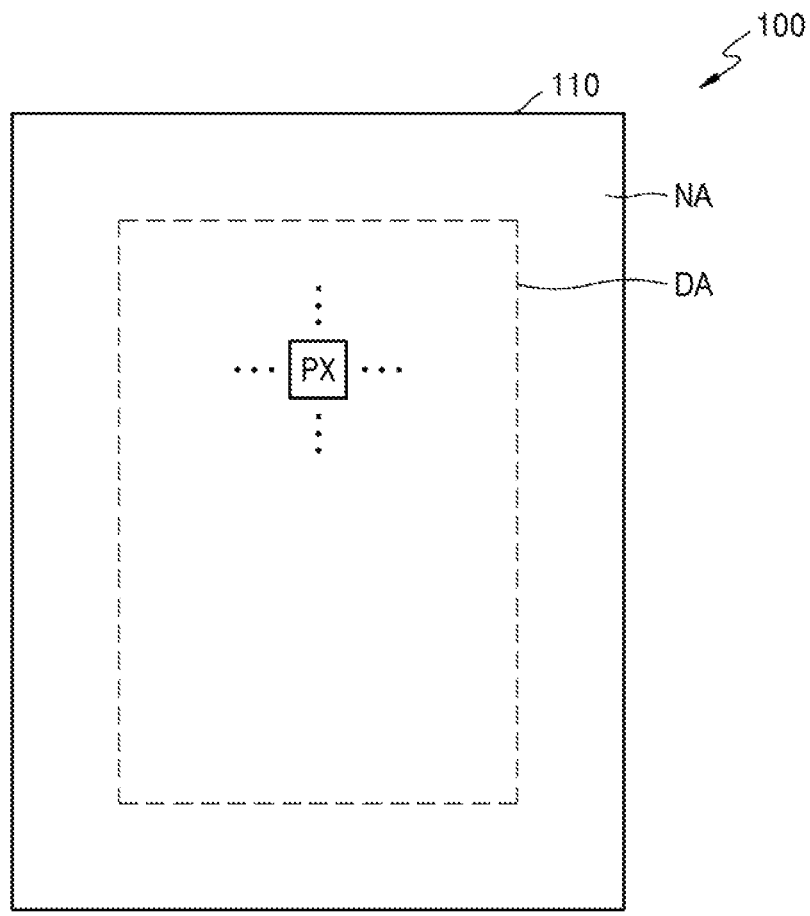
FIG. 3 is a plan view of a display panel according to an embodiment.
Figure 4:
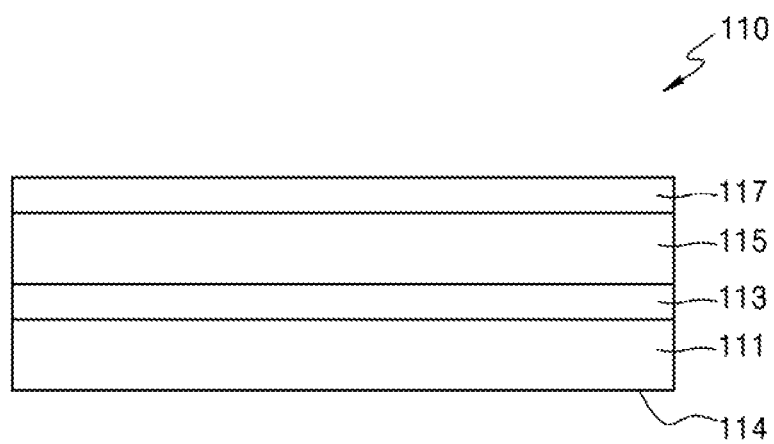
FIG. 4 is a cross-sectional view of a substrate according to an embodiment.

FIG. 1 is a perspective view of a display device according to an embodiment, and FIG. 2 is a partial cross-sectional view of the display device, taken along a line I-I' of FIG. 1. FIG. 3 is a plan view of a display panel according to an embodiment. FIG. 4 is a cross-sectional view of a substrate according to an embodiment.

Referring to FIGS. 1 and 2, a display device 10 according to an embodiment includes an optical sensor 400, a protective film 200, a display panel 100, and a window layer 300, which are sequentially stacked in a third direction (thickness direction).

According to an embodiment, the display device 10 can be incorporated into a portable device such as a tablet personal computer (PC), a smart phone, a personal digital assistant (PDA), a portable multimedia player (PMP), a game machine, or a wrist watch-type electronic device. The display device 10 is not limited to a portable device, and may be used with a large electronic device such as a TV or an external billboard, or a small electronic device such as a PC, a laptop computer, a car navigation unit, or a camera. Embodiments are not limited thereto, and can be incorporated into other electronic devices without departing from the concept of the present disclosure.

According to an embodiment, the display panel 100 may one of various display panels, such as an organic light-emitting display (OLED) panel, a liquid crystal display (LCD) panel, an electrophoretic display (EPD) panel, or an electrowetting display panel, but embodiments are not limited thereto. Hereinafter, an OLED panel will be described as an example.

According to an embodiment, the display panel 100 includes substrate 110 and a sealing member 120.

Referring to FIG. 3, according to an embodiment, the substrate 110 includes a display area DA in which a plurality of pixels PX are arranged in first and second directions, and a non-display area NA around the display area DA. Each of the pixels PX is in the display area DA of the substrate 110 and is connected to one of a plurality of gate lines that extend in the first direction and one of a plurality of data lines that extend in the second direction.

According to an embodiment, the substrate 110 is a flexible substrate. The substrate 110 may be a plastic substrate. Referring to FIG. 4, the substrate 110 has a stack structure that includes a first layer 111, a second layer 113 on the first layer 111, a third layer 115 on the second layer 113, and a fourth layer 117 on the third layer 115. A flexible substrate having a stack structure has low oxygen permeability and low water permeability compared with a flexible substrate that includes only an organic material, and has high durability. The substrate 110 is a transparent substrate, that is, a light-transmitting substrate.

According to an embodiment, the first layer 111 has a first thickness and a first refractive index, the second layer 113 has a second thickness and a second refractive index, the third layer 115 has a third thickness and a third refractive index, and the fourth layer 117 has a fourth thickness and a fourth refractive index. The first thickness and the first refractive index of the first layer 111 are respectively equal to the third thickness and the third refractive index of the third layer 115. The second thickness and the second refractive index of the second layer 113 are respectively equal to the fourth thickness and the fourth refractive index of the fourth layer 117. The first thickness of the first layer 111 and the third thickness of the third layer 115 are greater than the second thickness of the second layer 113 and the fourth thickness of the fourth layer 117, respectively.

According to an embodiment, the first layer 111 and the third layer 115 include organic materials. The first layer 111 and the third layer 115 include at least one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), polycarbonate, cellulose triacetate (TAC), or cellulose acetate propionate (CAP).

According to an embodiment, the second layer 113 and the fourth layer 117 include inorganic materials. The second layer 113 and the fourth layer 117 include silicon oxide (SiOx) or silicon nitride (SiNx). The fourth layer 117 may be a single-layer film or a multilayer film in which SiOx and SiNx are alternately and repeatedly stacked. The fourth layer 117 can function as a barrier film that blocks permeation of moisture or oxygen into the substrate 110.

According to an embodiment, a pad 172 is disposed on the non-display area NA of the substrate 110, and a flexible circuit board 170 is electrically connected to the substrate 110 through the pad 172 on the substrate 110. A driver that drives the display panel 100 is on the flexible circuit board 170. The driver is connected to at least some of signal lines, such as the gate lines, data lines, etc., on the substrate 110 through the flexible circuit board 170 to transmit signals to the pixels PX. In an embodiment, the driver is mounted on the flexible circuit board 170 as a chip on film (COF). However, embodiments are not limited thereto, and the mounting type can vary. A portion of the driver may be formed directly on the substrate 110 and a portion of the driver may be mounted on the flexible circuit board 170.

According to an embodiment, the substrate 110 is covered by the sealing member 120. The sealing member 120 covers at least the display area DA of the substrate 110.

According to an embodiment, the sealing member 120 may be an insulating layer that includes at least one inorganic film or at least one organic film. For example, the sealing member 120 can be a thin-film encapsulation (TFE) layer that includes at least one inorganic film or at least one organic film.

According to an embodiment, the protective film 200 is provided on a back surface 114 of the substrate 110. The protective film 200 is coupled to the back surface 114 of the substrate 110 by a first adhesive member 501.

According to an embodiment, the protective film 200 includes a plastic film that is one of PES, polyacrylate, PEI, PEN, PET, PPS, PAR, PI, PC, polycarbonate, TAC, CAP, or combinations thereof.

According to an embodiment, a material that constitutes the protective film 200 is not limited to a plastic resin, and may include an organic/inorganic composite material. The protective film 200 may include a porous organic layer with inorganic materials filling the pores of the organic layer. The protective film 200 may further include a functional layer on the plastic film. The functional layer includes a resin layer. The functional layer is formed by a coating method. In an embodiment, the protective film 200 is omitted.

According to an embodiment, the first adhesive member 501 is an organic adhesive layer such as an optically clear adhesive film (OCA), an optically clear resin (OCR), or a pressure sensitive adhesive film (PSA). The organic adhesive layer may be an organic layer that includes an adhesive material such as polyurethane, polyacryl, polyester, polyepoxy, or polyvinyl acetate. A thickness of the first adhesive member 501 is greater than that of the substrate 110.

According to an embodiment, the window layer 300 is disposed on the display panel 100. The window layer 300 includes an optical member 310 and a window 320.

According to an embodiment, the optical member 310 reduces reflectance by external light. The optical member 310 includes at least a polarizing film. The optical member 310 further includes a retardation film. In an embodiment, the optical member 310 is omitted.

According to an embodiment, the window 320 has a plate shape. The window 320 is substantially transparent. The window 320 includes, for example, a glass or a transparent polymer, and has a multilayer structure selected therefrom. The window 320 is externally exposed. The window 320 includes a bezel pattern. The multilayer structure of the window 320 further includes plastic films. The window 320 further includes a multilayer structure selected from a glass substrate, a plastic film, or a plastic substrate. The multilayer structure may be formed through a continuous process or through an adhesion process that uses an adhesive layer.

According to an embodiment, the optical member 310 is coupled to the sealing member 120 of the display panel 100 by a second adhesive member 503. The window 320 is coupled to the optical member 310 by a third adhesive member 505.

According to an embodiment, the second adhesive member 503 and the third adhesive member 505 are organic adhesive layers such as an OCA, an OCR, or a PSA, similar to the first adhesive member 501. The organic adhesive layer is an organic layer that includes an adhesive material such as polyurethane, polyacryl, polyester, polyepoxy, or polyvinyl acetate.

According to an embodiment, a touch panel is further provided between the display panel 100 and the window layer 300. The touch panel senses touch and a touch position. Further, according to an embodiment, the display panel 100 includes an antireflection layer. The antireflection layer includes a color filter or a conductive layer/insulating layer/conductive layer stack structure. The antireflection layer reduces external light reflectance by absorbing or destructively interfering or polarizing externally incident light. The antireflection layer replaces a function of the optical member 310.

According to an embodiment, the optical sensor 400 is provided under the display panel 100. The optical sensor 400 is a fingerprint sensor that can recognize fingerprints. In an embodiment, the optical sensor 400 is disposed on the back surface 114 of the display panel 100, such that the optical sensor 400 is not visible to the user and to prevent deterioration of image quality of the display device 10.

According to an embodiment, the optical sensor 400 includes at least one photodetector. The photodetector is one of a photodiode, a complementary metal oxide semiconductor (CMOS) image sensor, or a charge-coupled device (CCD) image sensor, but embodiments are not limited thereto. The photodetector generates an output signal that corresponds to incident light. The output signal generated by the photodetector is input to a drive circuit and is used to generate fingerprint information. That is, the display device 10 according to an embodiment detects a fingerprint pattern of a finger on the window layer 300 using output signals from photodetectors.

According to an embodiment, the optical sensor 400, the protective film 200, the display panel 100, and the window layer 300 are stored in a housing. The housing may be formed by injecting a synthetic resin, or may be formed of a metal such as stainless steel or titanium, but embodiments are not limited thereto. The housing protects the optical sensor 400, the protective film 200, the display panel 100, and the window layer 300 by absorbing external impacts.

Figure 5:
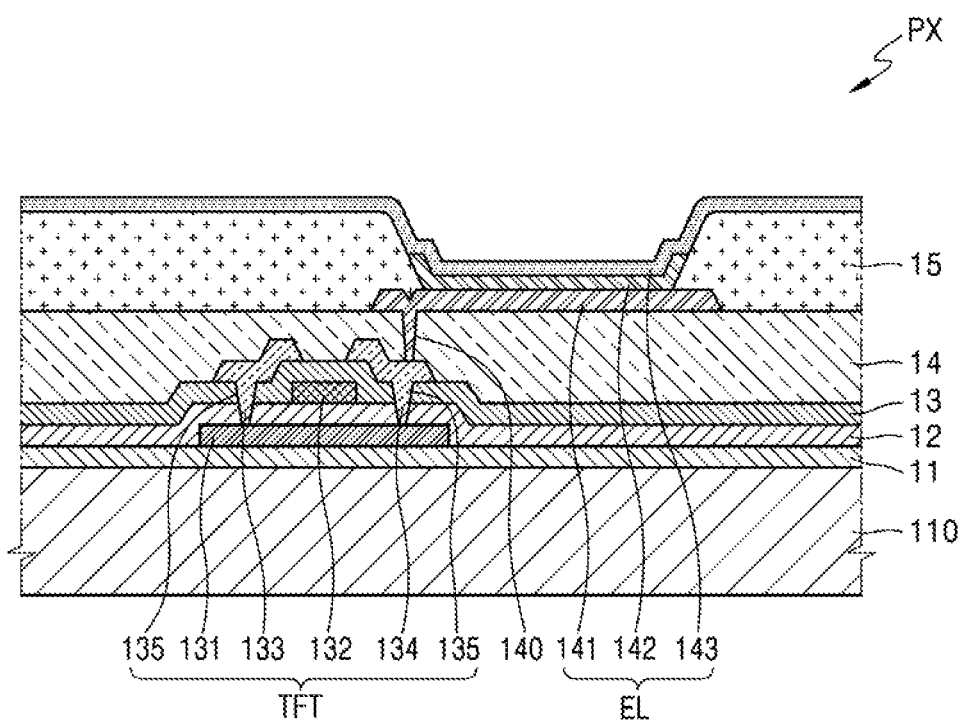
FIG. 5 is a cross-sectional view of an exemplary pixel according to an embodiment.

FIG. 5 is a cross-sectional view of an exemplary pixel according to an embodiment.

According to an embodiment, a pixel PX includes a light-emitting device EL and a pixel circuit that includes a thin-film transistor TFT electrically connected to the light-emitting device EL. The light-emitting device EL is an organic light-emitting device (OLED).

According to an embodiment, a buffer layer 11 is disposed on the substrate 110, a semiconductor layer is formed on the buffer layer 11, and then an active layer 131 of the thin-film transistor TFT is formed by patterning the semiconductor layer.

According to an embodiment, the buffer layer 11 includes at least one of an inorganic film or an organic film. The buffer layer 11 blocks impurity elements from permeating through the substrate 110 and planarizes the surface of the substrate 110, and may have a single-layer or a multilayer structure with inorganic materials such as SiOx or SiNx. The buffer layer 11 is formed on the fourth layer 117, which is an uppermost layer of the substrate 110. The buffer layer 11 may be omitted.

According to an embodiment, the semiconductor layer includes various materials. For example, the semiconductor layer includes an inorganic semiconductor such as amorphous silicon or crystalline silicon. As another example, the semiconductor layer includes an oxide semiconductor or an organic semiconductor.

According to an embodiment, a first insulating layer 12 is formed on the active layer 131, and a gate electrode 132 is formed by forming a first conductive layer on the first insulating layer 12, and patterning the first conductive layer.

According to an embodiment, the first insulating layer 12 is an inorganic insulating film. The first insulating layer 12 may have a single layer or multiple layers of one or more insulating films, such as SiOx, SiNx, silicon oxynitride (SiON), aluminum oxide ($Al_2O_3$), tantalum oxide ($Ta_2O_5$), hafnium oxide ($HfO_2$), zinc oxide ($ZrO_2$), (Ba, Sr) $TiO_3$ (BST), or lead zirconate titanate (PZT).

According to an embodiment, the first conductive layer is formed of various conductive materials. For example, the first conductive layer may have a single layer or multiple layers of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

According to an embodiment, the second insulating layer 13 is formed on the gate electrode 132, and the second insulating layer 13 is patterned to form contact holes 135 that expose a portion of a source region and a drain region of the active layer 131.

According to an embodiment, the second insulating layer 13 is an inorganic insulating film. The second insulating layer 13 may have a single layer or multiple layers of one or more insulating films, such as SiOx, SiNx, SiON, $Al_2O_3$, $Ta_2O_5$, $HfO_2$, $ZrO_2$, BST or PZT. In another embodiment, the second insulating layer 13 is an organic insulating film.

According to an embodiment, a second conductive layer is formed on the second insulating layer 13, and the second conductive layer is patterned to form a source electrode 133 and a drain electrode 134 which respectively contact the source region and the drain region of the active layer 131 through the contact holes 135.

According to an embodiment, the second conductive layer may have a single layer or multiple layers that include the same material as the first conductive layer.

According to an embodiment, a third insulating layer 14 is formed on the source electrode 133 and the drain electrode 134, and the third insulating layer 14 is patterned to form a via hole 140 that exposes a portion of one of the source electrode 133 or the drain electrode 134 of the third insulating layer 14.

According to an embodiment, the third insulating layer 14 may have a single layer or multiple layers of an organic insulating film. The third insulating layer 14 includes a general polymer such as polymethylmethacrylate (PMMA) or polystyrene (PS), an acrylic polymer, an imide polymer, an aryl ether polymer, an amide polymer, a fluorine-based polymer, a p-xylene-based polymer, a vinyl alcohol polymer, or a blend thereof. For example, the third insulating layer 14 includes polyimide, polyamide, acrylic resin, etc.

According to an embodiment, the light-emitting device EL that is electrically connected to the thin-film transistor TFT is formed on the third insulating layer 14.

According to an embodiment, a third conductive layer is formed on the third insulating layer 14 and the third conductive layer is patterned to form a first electrode 141 of the light-emitting device EL. The first electrode 141 is electrically connected to one of the source electrode 133 or the drain electrode 134 through the via hole 140 of the third insulating layer 14.

According to an embodiment, the third conductive layer includes a reflective layer that includes at least one of Ag, Mg, Al, Pt, Pd, Au, Ni, Nd, Ir, Cr, or a compound thereof, and a transparent or semitransparent electrode layer formed on the reflective layer.

According to an embodiment, a fourth insulating layer 15 is formed on the first electrode 141 that exposes at least a portion of the first electrode 141 and that covers an edge of the first electrode 141.

According to an embodiment, the fourth insulating layer 15 may have a single layer or multiple layers of the above-described inorganic insulating film or organic insulating film.

According to an embodiment, an intermediate layer 142 is formed in a region where the first electrode 141 is exposed, and a second electrode 143 is formed on the intermediate layer 142 that faces the first electrode 141.

According to an embodiment, the intermediate layer 142 includes at least an emissive layer (EML), and may further include at least one functional layer, such as a hole injection layer (HIL), a hole transport layer (HTL), an electron transport layer (ETL), or an electron injection layer (EIL).

According to an embodiment, the EML may be a red emissive layer, a green emissive layer, or a blue emissive layer. Alternatively, the EML may have a multilayer structure in which a red emissive layer, a green emissive layer, and a blue emissive layer are stacked, or may have a single layer structure that includes a red light-emitting material, a green light-emitting material, and a blue light-emitting material, to emit white light.

According to an embodiment, FIG. 5 shows that the intermediate layer 142 is patterned to correspond only to the first electrode 141. However, this is for the sake of convenience. At least some of the intermediate layer 142 may be formed integrally with the intermediate layer 142 of the light-emitting device EL of an adjacent pixel.

According to an embodiment, the second electrode 143 includes a layer that includes lithium (Li), calcium (Ca), LiF/Ca, lithium fluoride (LiF)/aluminum (Al), magnesium (Mg), or a compound thereof, and an auxiliary electrode or a bus electrode line that includes a material for forming a transparent electrode, such as indium tin oxide (ITO), indium zinc oxide (IZO), zinc oxide (ZnO), or indium oxide ($In_2O_3$). The second electrode 143 is formed on the entire surface of the display area DA.

According to an embodiment, the light-emitting device EL is arranged so as not to overlap the thin-film transistor TFT, or to at least partially overlap the thin-film transistor TFT.

According to an embodiment, the sealing member 120 is disposed on the second electrode 143. An inorganic film or an organic film may be further provided between the second electrode 143 and the sealing member 120.

Figure 6:
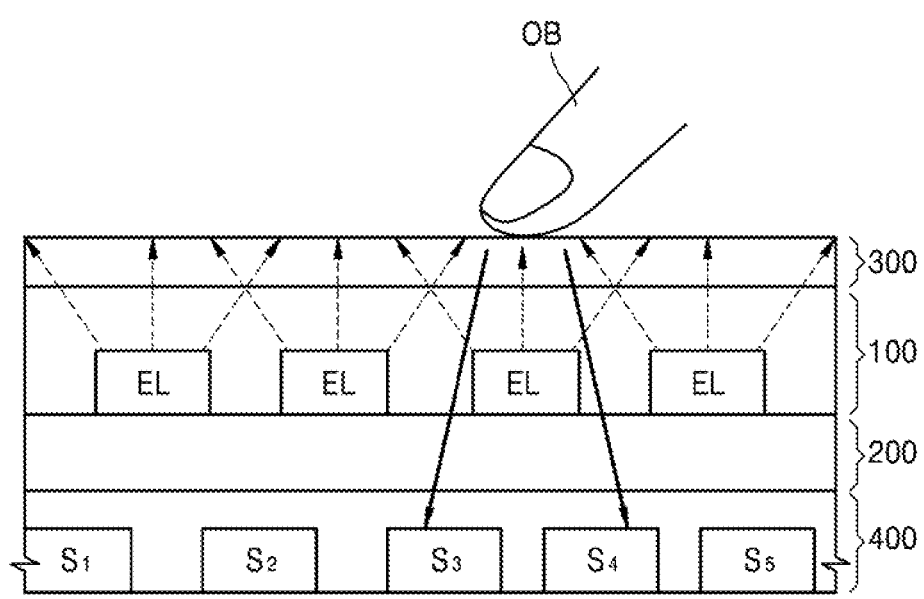
FIG. 6 illustrates an operation of an optical sensor according to an embodiment.

FIG. 6 illustrates an operation of an optical sensor according to an embodiment.

Referring to FIG. 6, according to an embodiment, an optical sensor 400 includes one or more photodetectors S1 to S5. The optical sensor 400 uses light emitted from the light-emitting devices EL in the display panel 100 without using a separate light source.

According to an embodiment, the photodetectors S1 to S5 and the like may be regularly positioned or irregularly scattered in the display area DA of the display panel 100. The photodetectors S1 to S5 are positioned adjacent to the light-emitting devices EL of the display panel 100, or at least some of the photodetectors S1 to S5 overlap the light-emitting devices EL.

In an embodiment, the photodetectors S1 to S5 are provided in one-to-one correspondence with the pixels and have the same resolution as the pixels. In another embodiment, the number of photodetectors is less than the number of pixels. The size, number, resolution, position or arrangement of the photodetectors may vary. For example, the size, number, resolution, position or arrangement of the photodetectors is determined by taking into consideration various factors such as the amount of received light required for the photodetectors for fingerprint sensing, resolution or crosstalk.

According to an embodiment, the light-emitting device EL emits light toward the window layer 300. A portion of the emitted light, represented by the dashed lines, is reflected by an external object OB, such as a fingerprint, in a direction toward the substrate 110. The reflected light, represented by the solid lines, are received by the photodetectors S1 to S5. The photodetectors S1 to S5 convert the absorbed light into current and convert the obtained current into a digital value through an analog-to-digital converter (ADC).

According to an embodiment of FIG. 6, a configuration of the optical sensor 400 is simplified and the manufacturing cost is reduced by using the light-emitting device EL of the display panel 100 as a light source, without using a separate light source. Only some light-emitting devices EL of the pixels of the display panel 100 are used for fingerprint sensing.

Figure 7:
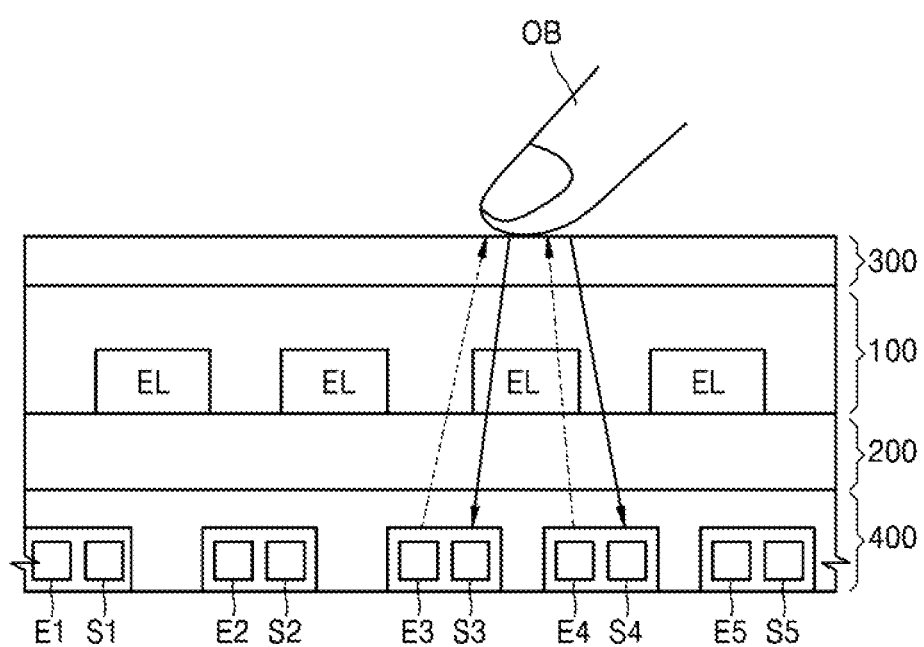
FIG. 7 illustrates an operation of an optical sensor according to another embodiment.

FIG. 7 illustrates an operation of an optical sensor according to another embodiment.

Referring to FIG. 7, the optical sensor 400 includes one or snore light sources E1 to E5 and one or more photodetectors S1 to S5.

According to an embodiment, the light sources E1 to E5 emit visible light or infrared light and include a light-emitting diode (LED) or an infra-red (IR) LED. The light sources E1 to E5 and the photodetectors S1 to S5 are disposed in the display area DA of the display panel 100. One light source and one photodetector constitute a sensor unit. The light source and the photodetector of each sensor unit are arranged at a predetermined distance and at a predetermined angle with respect to each other.

According to an embodiment, the sensor units may be regularly positioned or irregularly scattered in the display area DA of the display panel 100. The sensor units are arranged adjacent to the light-emitting device EL of the display panel 100, or at least some of the sensor units overlap the light-emitting device EL.

In an embodiment, the sensor units are provided in one-to-one correspondence with the pixels and have the same resolution as the pixels. In another embodiment, the number of sensor units is less than the number of pixels. The size, number, resolution, position or arrangement of the sensor units can vary. For example, the size, number, resolution, position or arrangement of the sensor units can be determined by taking into consideration various factors, such as the amount of received light required for the sensor units to sense fingerprints, resolution or cross-talk.

According to an embodiment, the light sources E1 to E5 emit light toward the window layer 300. A portion of the emitted light, represented by the dashed lines, is reflected by an external object OB, such as a fingerprint, in a direction toward the substrate 110. The reflected light, represented by solid lines, is received by the photodetectors S1 to S5. The photodetectors S1 to S5 receive visible or infrared light. The photodetectors S1 to S5 convert the absorbed light into current and convert the obtained current into a digital value through the ADC.

In embodiments of FIGS. 6 and 7, the reflected light is received by the photodetectors S1 to S5 of the optical sensor 400 through the window layer 300, the display panel 100, and the protective film 200. That is, the reflected light needs to pass through multiple layers, such as the window layer 300 of the display panel 100, the substrate 110, the first adhesive member 501, and the protective film 200. The photodetectors S1 to S5 need to receive a sufficient amount of reflected light to acquire fingerprint information of the object OB.

A film-type layer has a relatively uniform thickness. On the other hand, a deviation in light transmittance by position may occur depending on a stack structure of the first to fourth layers 111, 113, 115, and 117 of the substrate 110 and thickness distribution of an adhesive member. The overall light transmittance can be lowered as deviations in light transmittance by position increase due to thickness distribution of the layers. This can lead to poor light reception and deterioration of the sensing function of the photodetectors S1 to S5.

An embodiment of the disclosure can improve a light reception rate of the optical sensor 400 by increasing light transmittance by adjusting a refractive index of each of the first to fourth layers 111, 113, 115, and 117 of the substrate 110 and the first adhesive member 501.

In an embodiment, each of the first layer 111 and the third layer 115 of the substrate 110 has a thickness of about 5 μm and each of the second layer 113 and the fourth layer 117 has a thickness of 1 μm. The first layer 111 and the third layer 115 have a refractive index of about 1.7 and the second layer 113 and the fourth layer 117 have a refractive index of from about 1.65 to about 1.8. The protective film 200 as a thickness of about 75 μm, and the first adhesive member 501 has a thickness of about 13 μm. The protective film 200 has a refractive index of about 1.59, and the first adhesive member 501 has a refractive index of from about 1.59 to about 1.7. The refractive index of the first adhesive member 501 is at least the refractive index of the protective film 200.

Table 1 below shows measurement results of transmittances according to refractive indexes of the first adhesive member 501 and the first layer 111 to the fourth layer 117 of the substrate 110. Respective thicknesses of the protective file 200 the first adhesive member 501 the first layer 111 the second layer 113, the third layer 115 and the fourth layer 117 are 75 μm, 13 μm, 5 μm, 1 μm, 5 μm, and 1 μm, and the transmittances are values measured for light having a wavelength of about 530 nm to 570 nm.

TABLE 1

|  | No. | 1 | 2 | 3 | 4 | 5 | 6 |
| --- | --- | --- | --- | --- | --- | --- | --- |
| Refractive index | Fourth layer | 1.45 | 1.45 | 1.45 | 1.45 | 1.7 | 1.7 |
|  | Third layer | 1.7 | 1.7 | 1.7 | 1.7 | 1.7 | 1.7 |
|  | Second layer | 1.45 | 1.45 | 1.45 | 1.7 | 1.7 | 1.7 |
|  | First layer | 1.7 | 1.7 | 1.7 | 1.7 | 1.7 | 1.7 |
|  | First adhesive member | 1.51 | 1.6 | 1.7 | 1.51 | 1.51 | 1.7 |
|  | Protective film | 1.59 | 1.59 | 1.59 | 1.59 | 1.59 | 1.59 |
| Transmittance (%) | Average | 5.58 | 5.59 | 5.59 | 5.6 | 5.83 | 5.86 |
|  | Maximum | 6.34 | 6.26 | 6.24 | 6.21 | 6.18 | 6.03 |
|  | Minimum | 4.39 | 4.44 | 4.54 | 4.89 | 5.53 | 5.69 |
|  | Maximum-minimum | 1.95 | 1.83 | 1.7 | 1.32 | 0.65 | 0.34 |

Referring to Table 1, it can be seen that the average transmittance is the highest, and a deviation between the maximum transmittance and the minimum transmittance is the smallest when the first layer 111 and the third layer 115 of the plastic substrate 110 have a refractive index of about 1.7, when the first adhesive member 501 has a refractive index of about 1.7, and when the second layer 113 and the fourth layer 117 of the plastic substrate 110 have a refractive index of about 1.7. That is, since the refractive indices of the second and fourth layers 113 and 117 and the first adhesive member 501 are similar to the refractive index of the first and third layers 111 and 115, it is possible to minimize a deviation in light transmittance by position of the substrate 110.

Embodiment of the disclosure can provide a display device that can adopt an optical sensor with high transmittance by using the plastic substrate 110 and the first adhesive member 501 with a refractive index that minimizes a deviation in light transmittance by position of the substrate 110.

Embodiments can provide a display device having an optical sensor with high transmittance.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate;
a plurality of pixels on a first surface of the substrate;
a protective film below a second surface of the substrate opposite the first surface of the substrate;
an adhesive member between the substrate and the protective film; and
an optical sensor below a second surface of the protective film opposite a first surface of the protective film that faces the second surface of the substrate,
wherein the substrate comprises:
a first layer that has a first refractive index and includes an organic material;
a second layer above the first layer, wherein the second layer has a second refractive index and includes an inorganic material,
a third layer above the second layer, wherein the third layer has a third refractive index and includes an organic material,
a fourth layer above the third layer, wherein the fourth layer has a fourth refractive index and includes an inorganic material, and,
wherein the protective film is between the adhesive member and the optical sensor, and has a substantially uniform thickness, and
wherein each of the first layer and the third layer of the substrate is thicker than the second layer and the fourth layer of the substrate, and refractive indices of the first layer, the second layer, the third layer and the fourth layer are equal to each other and are also equal to a refractive index of the adhesive member, and are greater than a refractive index of the protective film, so that a deviation in light transmittance of the substrate due to a thickness distribution of the first layer, the second layer, the third layer, the fourth layer and the adhesive member is minimized, wherein the deviation in light transmittance is a difference between a maximum transmittance of the substrate and a minimum transmittance of the substrate.

2. The display device of claim 1, wherein a refractive index of the fourth layer ranges from 1.65 to 1.8.

3. The display device of claim 1, wherein a refractive index of the adhesive member ranges from 1.5 to 1.7.

4. The display device of claim 1, wherein a refractive index of the second layer ranges from 1.65 to 1.8.

5. The display device of claim 1, further comprising:
a sealing member above the fourth layer;
an optical member above the sealing member; and
a window above the optical member.

6. The display device of claim 1, wherein a thickness of the adhesive member is greater than a thickness of the substrate.

7. The display device of claim 1, wherein a thickness of the protective film is greater than a thickness of the substrate.

8. The display device of claim 5, therein the optical sensor comprises:
a photodetector that receives light emitted by the display device in a window direction that is reflected in a substrate direction from the optical member.

9. The display device of claim 5, wherein the optical sensor comprises:
a light source that emits visible or infrared light in a window direction; and
photodetector that receives emitted light that is reflected in a substrate direction from the optical member.

* * * * *